(12) United States Patent
Lee (10) Patent No.: US 9,543,306 B1
(45) Date of Patent: Jan. 10, 2017

(54) SUB WORD LINE DRIVER OF A SEMICONDUCTOR MEMORY DEVICE

(71) Applicant: SK hynix Inc., Gyeonggi-do (KR)

(72) Inventor: Han Kyu Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/958,432

(22) Filed: Dec. 3, 2015

(30) Foreign Application Priority Data

Jun. 30, 2015 (KR) ........................ 10-2015-0093466

(51) Int. Cl.
| | |
|---|---|
| H01L 27/108 | (2006.01) |
| H01L 27/105 | (2006.01) |
| H01L 27/02 | (2006.01) |
| H01L 29/423 | (2006.01) |
| H01L 27/092 | (2006.01) |

(52) U.S. Cl.
CPC ......... *H01L 27/105* (2013.01); *H01L 27/0207* (2013.01); *H01L 27/092* (2013.01); *H01L 29/42356* (2013.01); *H01L 27/10891* (2013.01)

(58) Field of Classification Search
None
See application file for complete search history.

(56) References Cited

U.S. PATENT DOCUMENTS

| | | | | |
|---|---|---|---|---|
| 6,052,301 | A * | 4/2000 | Ikeda ...................... | G11C 7/18 257/E27.084 |
| 6,392,942 | B2 * | 5/2002 | Noda ....................... | G11C 7/18 257/E27.097 |
| 7,016,214 | B2 * | 3/2006 | Kawamata .......... | G11C 11/4087 257/369 |
| 2006/0098469 | A1 * | 5/2006 | Yang ...................... | G11C 5/063 365/63 |
| 2006/0163613 | A1 * | 7/2006 | Chang .................. | H01L 27/0207 257/202 |
| 2008/0112253 | A1 * | 5/2008 | Youn ........................ | G11C 8/08 365/230.06 |
| 2009/0213647 | A1 | 8/2009 | Choi et al. | |
| 2011/0032786 | A1 * | 2/2011 | Yang ........................ | G11C 8/08 365/230.06 |
| 2011/0286262 | A1 | 11/2011 | Kitayama | |
| 2012/0043616 | A1 * | 2/2012 | Lee ........................ | G11C 5/063 257/369 |
| 2012/0193720 | A1 * | 8/2012 | Han .................. | H01L 27/10891 257/368 |
| 2013/0168774 | A1 | 7/2013 | Jeon et al. | |
| 2015/0380416 | A1 * | 12/2015 | Saino .................. | G11C 11/4085 365/230.06 |

FOREIGN PATENT DOCUMENTS

| | | |
|---|---|---|
| KR | 1020020084515 | 11/2002 |
| KR | 1020130079842 | 7/2013 |

\* cited by examiner

*Primary Examiner* — Benjamin Sandvik
(74) *Attorney, Agent, or Firm* — IP & T Group LLP (57) ABSTRACT

A sub word line driver of a semiconductor memory device including a sub word line driver is disclosed. The sub word line driver of a semiconductor memory device comprising: a semiconductor substrate including an active region extended in a first direction; a plurality of gate electrodes extended in a second direction perpendicular to the active region; first and second metal contacts formed over the active region between the gate electrodes; a plurality of metal pads coupled to the first metal contacts; and a plurality of metal signal lines coupled to the second metal contacts, extended in the second direction, and bent at specific parts adjacent to the metal pads.

5 Claims, 6 Drawing Sheets

SUB WORD LINE DRIVER OF A SEMICONDUCTOR MEMORY DEVICE

CROSS-REFERENCE TO RELATED APPLICATION

The present application claims priority of Korean patent application No. 10-2015-0093466, filed on 30 Jun. 2015, the disclosure of which is hereby incorporated in its entirety by reference.

BACKGROUND OF THE INVENTION

Embodiments of the present disclosure relate to a semiconductor memory device and, more particularly, to a sub word line driver of a semiconductor memory device with a pitched layout that is repeated.

A semiconductor memory device may write or read data to or from memory cells coupled to a word line and a bit line. Memory cells coupled to a word line may form a single row and operate according to a voltage applied to the word line.

With increasing storage capacity in semiconductor memory devices, a speed delay problem has arisen when a word line voltage is applied to a word line and its memory cells.

In order to address the speed delay problem, an improved scheme has been proposed in which a single word line is divided into sub word lines and each sub word line is driven by a sub word line driver. The sub word line driver array includes multiple sub word line drivers repeatedly arranged between cell regions, and includes a pitched layout in which a plurality of metal signal lines repeat in a regular manner.

The sub word lines include active regions and gate electrodes. Metal contacts are arranged at both sides and the center of the active regions, and metal pads are coupled to the metal contacts.

In addition, other metal contacts not coupled to the metal pads may be coupled to a single metal signal line.

The metal pads may be arranged in the same column at both sides and the center of the active regions. Since the metal pads are arranged in a single line, metal signal lines may also be arranged in a single line with respect to the metal pads.

BRIEF SUMMARY OF THE INVENTION

Various embodiments of the present disclosure are directed to a layout of a semiconductor memory device in which part of arranged metal signal lines of a sub word line driver (SWD) are bent with respect to a metal pad and therefore distance between a gate and a metal contact of the sub word line driver (SWD) is uniform, resulting in improvement of a mismatch among the sub word line drivers(SWDs).

In accordance with an aspect of the present disclosure, A sub word line driver of a semiconductor memory device comprising: a semiconductor substrate including an active region extended in a first direction; a plurality of gate electrodes extended in a second direction perpendicular to the active region; first and second metal contacts formed over the active region between the gate electrodes; a plurality of metal pads coupled to the first metal contacts; and a plurality of metal signal lines coupled to the second metal contacts, extended in the second direction, and bent at specific parts adjacent to the metal pads.

The sub word line driver is repeatedly arranged in a column direction of the semiconductor memory device.

The sub word line driver is arranged between a plurality of cell regions of the semiconductor memory device.

Further comprising a PMOS transistor region and a NMOS transistor region.

A critical dimension of the gate electrode arranged in the PMOS transistor region is larger in size than a critical dimension of the gate electrode arranged in the NMOS transistor region.

The first metal contacts are arranged at both sides and a center part of the active region.

Distances between the gate electrodes and the second metal contacts are uniform.

One or more of the metal signal lines arranged at an outermost part of an upper portion of the sub word line driver are bent along upper outer walls of the metal pads, and one or more of the metal signal lines arranged at an outermost part of an lower portion of the sub word line driver are bent along lower outer walls of the metal pads.

Bent portions of the metal signal lines of first sub word line drivers are arranged to overlap with second sub word line drivers neighboring with the first sub word line driver.

In accordance with another aspect of the present disclosure, A sub word line driver of a semiconductor memory device comprising: a semiconductor substrate including an active region extended in a first direction; a plurality of gate electrodes extended in a second direction perpendicular to the active region, and formed to include rectangular holes through which parts of the active region are exposed; first metal contacts formed over the active region between the gate electrodes; second metal contacts formed over the active region exposed by the holes; a plurality of metal pads coupled to the first metal contacts; and a plurality of metal signal lines coupled to the second metal contacts, extended in the second direction, and bent at specific parts adjacent to the metal pads.

The sub word line driver is repeatedly arranged in a column direction of the semiconductor memory device, and wherein bent portions of the metal signal lines of first sub word line drivers are arranged to overlap with second sub word line drivers neighboring with the first sub word line driver.

Distances between the gate electrodes and the second metal contacts are uniform.

One or more of the metal signal lines arranged at an outermost part of an upper portion of the sub word line driver are bent along upper outer walls of the metal pads, and one or more of the metal signal lines arranged at an outermost part of a lower portion of the sub word line driver are bent along lower outer walls of the metal pads.

In accordance with another aspect of the present disclosure, A sub word line driver of a semiconductor memory device comprising: a NMOS transistor region; a semiconductor substrate including one or more active regions extended in a first direction; a plurality of gate electrodes extended in a second direction perpendicular to the active regions; first and second metal contacts formed over the active regions between the gate electrodes; a plurality of metal pads coupled to the first metal contacts; and a plurality of metal signal lines coupled to the second metal contacts, extended in the second direction, and bent at specific parts adjacent to the metal pads.

The sub word line driver is repeatedly arranged in a column direction of the semiconductor memory device.

Neighboring active regions are arranged in pairs, and wherein the neighboring active regions of each pair are connected at center parts thereof.

Four of the gate electrodes are arranged to pass through the active regions, and wherein two of the four gate electrodes arranged at center parts of the active regions are coupled to each other by sides thereof.

Distances between the gate electrodes and the second metal contacts are uniform.

One or more of the metal signal lines arranged at an outermost part of an upper portion of the sub word line driver are bent along upper outer walls of the metal pads, and one or more of the metal signal lines arranged at an outermost part of a lower portion of the sub word line driver are bent along lower outer walls of the metal pads.

Bent portions of the metal signal line of first sub word line drivers are arranged to overlap with second sub word line drivers neighboring with the first sub word line driver.

It is to be understood that both the foregoing general description and the following detailed description are exemplary and explanatory and are intended to provide further explanation of the claims.

DETAILED DESCRIPTION

Reference will now be made in detail to embodiments, examples of which are illustrated in the accompanying drawings. Wherever possible, the same reference numbers will be used throughout the drawings to refer to the same or like parts. In the following description, related known configurations or functions incorporated herein will be omitted when it may make the subject matter less clear.

Figure 1:
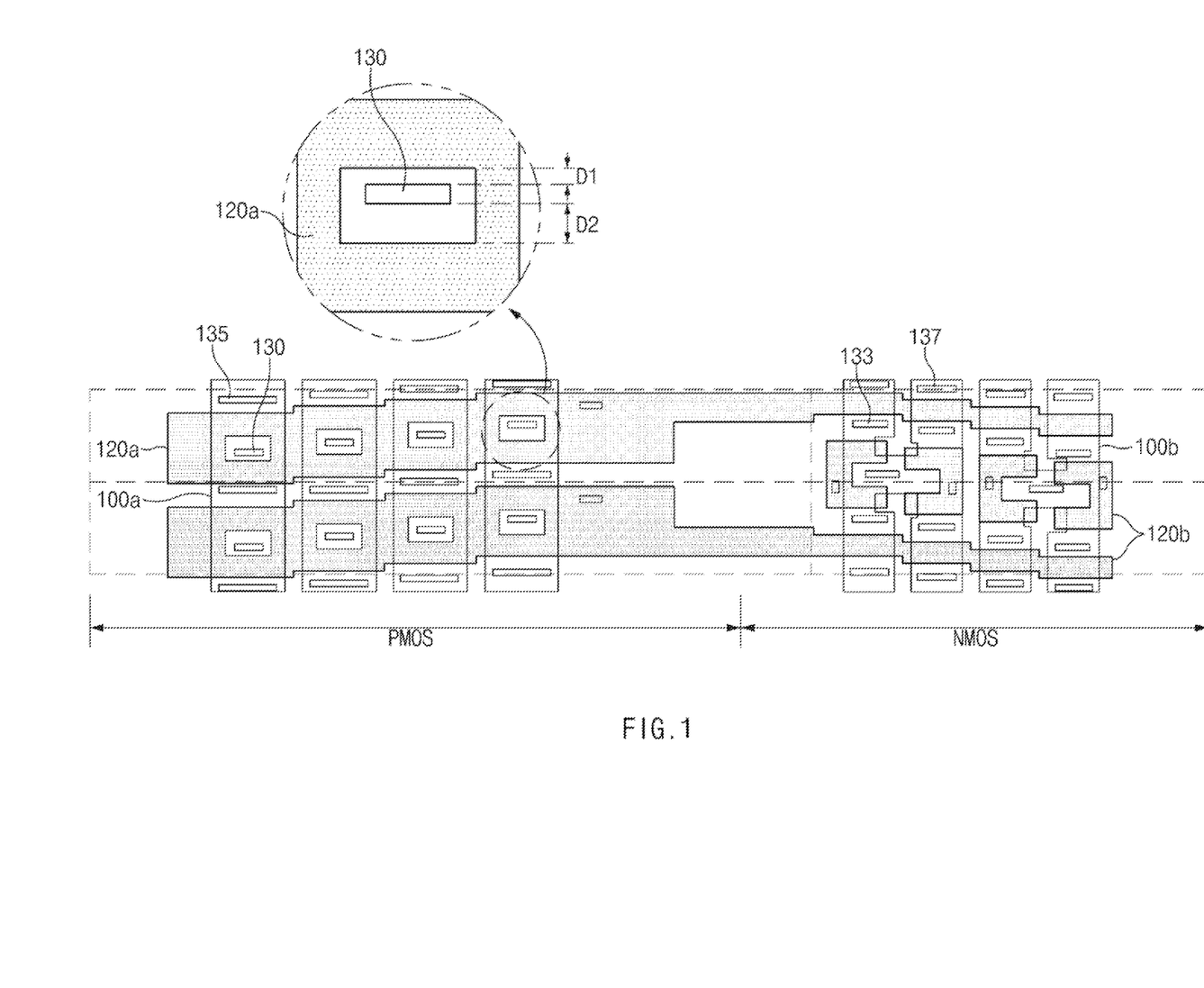
FIG. 1 is a layout diagram illustrating a semiconductor memory device including a sub word line driver (SWD) according to a comparative example.

FIG. 1 is a layout diagram illustrating a semiconductor memory device including a sub word line driver (SWD) according to a comparative example.

Referring to FIG. 1, the sub word line driver (SWD) includes a PMOS transistor region and an NMOS transistor region. Each of the PMOS transistor region and the NMOS transistor region includes a plurality of active regions (100a, 100b), a plurality of gate electrodes (120a, 120b), a plurality of metal contacts (130, 133, 135, 137), a plurality of metal pads (not shown), and a plurality of metal signal lines (not shown).

The active regions (100a, 100b) are formed in a bar shape extended in a first direction, and are repeatedly arranged in a second direction. The gate electrodes (120a, 120b) are formed in a line extended in a second direction perpendicular to the active regions (100a, 100b). In this case, the gate electrode (120a) of the PMOS transistor region includes rectangular holes, and two gate electrodes 120a pass the single active region (100a).

In addition, four gate electrodes 120b of the NMOS transistor region are arranged to pass through the single active region (100b), and two gate electrodes (120b) passing through the center part of the active region (100b) are connected to each other by sides thereof.

The metal contacts (135, 137) arranged at both sides and the center part of each active region (100a,100b) are coupled to the metal pads, and each of the remaining metal contacts (130, 133) other than the metal contacts (135, 137) are connected to one of the metal signal lines.

In this case, the metal pads are arranged in the same line at both sides and the center parts of the active regions (100a, 100b). Since the metal pads are arranged in a single line, the metal signal lines are also arranged in a single line with respect to the metal pads.

As shown in FIG. 1, distances (D1, D2) between the gate electrodes (120a, 120b) and the metal contacts (130, 133, 135, 137) located in the pitched layout of the sub word line driver (SWD) are different, and thus a mismatch among the sub word line drivers (SWDs) may occur.

As can be seen from FIG. 1, the metal contacts (130, 133, 135, 137) are not formed in a line and are shifted by a predetermined distance. However, the metal pads must be arranged in a single line, and the metal signal lines are also arranged in a line along the metal pads. As a result, it becomes difficult to guarantee a process margin among the metal signal lines, the metal pads, and the metal contacts, and thus there arises a mismatch among the sub word line drivers (SWDs).

In addition, the respective distances D1 and D2 between the gate electrodes (120a, 120b) and the metal contacts (130, 133, 135, 137) varies. Therefore it is impossible to extend the spacing between each gate electrode and each metal contact, and to extend a critical dimension (CD) of the gate electrode, which leads to difficulty in gate patterning.

Figure 2:
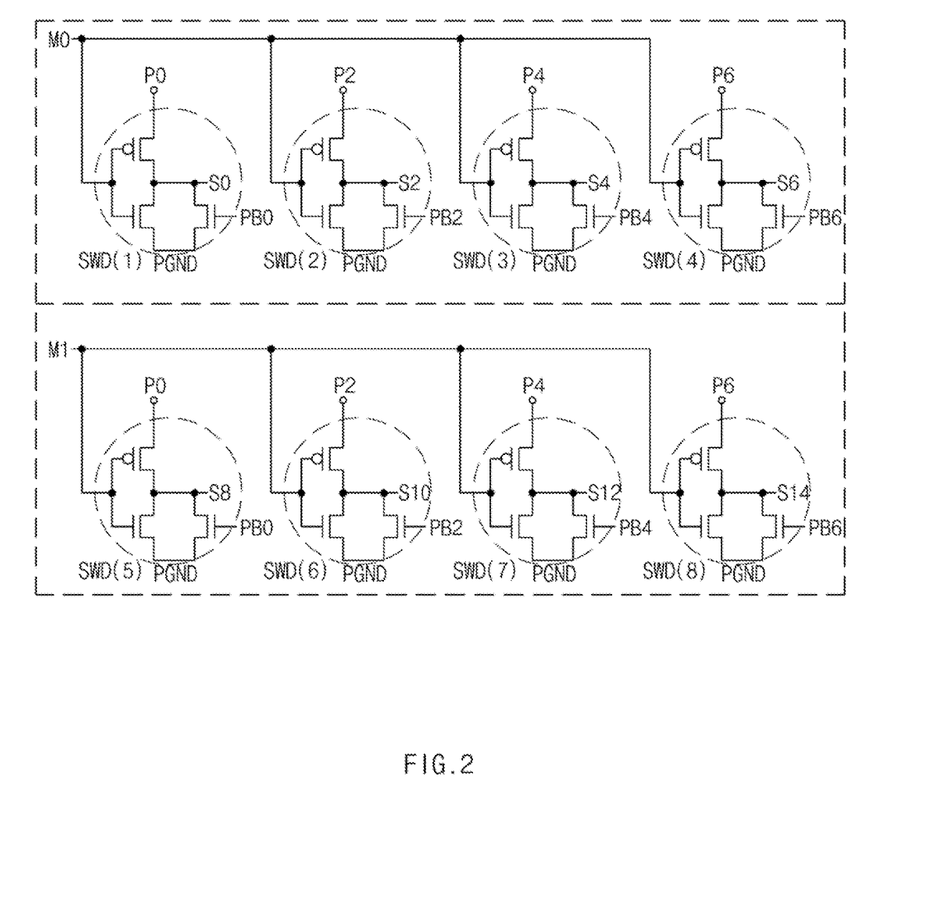
FIG. 2 is a circuit diagram illustrating a driving circuit of a semiconductor memory device including a sub word line driver (SWD) according to an embodiment of the present disclosure.

FIG. 2 is an equivalent circuit diagram illustrating a semiconductor memory device including a sub word line driver (SWD) according to an embodiment of the present disclosure. FIG. 2 exemplarily shows 8 SWDs (SWD(1) to SWD(8)) a number of which may vary according to circuit design.

Referring to FIG. 2, 4 sub word line drivers (SWD(1), SWD(2), SWD(3), SWD(4)) in a single row among 8 SWDs (SWD(1) to SWD(8)) may be coupled to a single metal line M0.

The remaining 4 SWDs (SWD(5), SWD(6), SWD(7), SWD(8)) in another single row may be coupled to another single metal line M1. The 4 SWDs (SWD(1) to SWD(4)) coupled to the metal line M0 and the 4 SWDs (SWD(5) to SWD(8)) coupled to the metal line M1 may be arranged in different rows.

The 4 SWDs (SWD(1) to SWD(4)) sharing the metal line M0 extended in a line along a first direction, for example a row direction, are located in the same row, and the 4 SWDs (SWD(1) to SWD(4)) will hereinafter be referred to as first SWDs. In addition, the remaining 4 SWDs (SWD(5) to SWD(8)) coupled to the metal line M1 extended in a line along the first direction will hereinafter be referred to as second SWDs.

The first SWDs (SWD(1) to SWD(4)) and the second SWDs (SWD(5) to SWD(8)) may be repeatedly disposed in a column direction in alternate manner.

Each of the first and second SWDs (SWD(1) to SWD(8)) may include a single PMOS transistor and two NMOS transistors.

Gate input signals of the first SWDs (SWD(1) to SWD(4)) may be a metal line signal M0, and selection inversion signals PB0, PB2, PB4, and PB6. Source input signals of the first SWDs (SWD(1) to SWD(4)) may be selection signals (P0, P2, P4, P6, and PGND).

In addition, Output signal of the first SWDs (SWD(1) to SWD(4)) may be metal signal lines (S0, S2, S4, S6).

Gate input signals of the second SWDs (SWD(5) to SWD(8)) may be a metal line signal M1, the selection inversion signals (PB0, PB2, PB4, and PB6). Source input signals of the second SWDs (SWD(5) to SWD(8)) may be the selection signals (P0, P2, P4, P6, and PGND).

In addition, output signals of the second SWDs (SWD(5) to SWD(8)) may be metal signal lines (S8, S10, S12, S14).

Figure 3A:
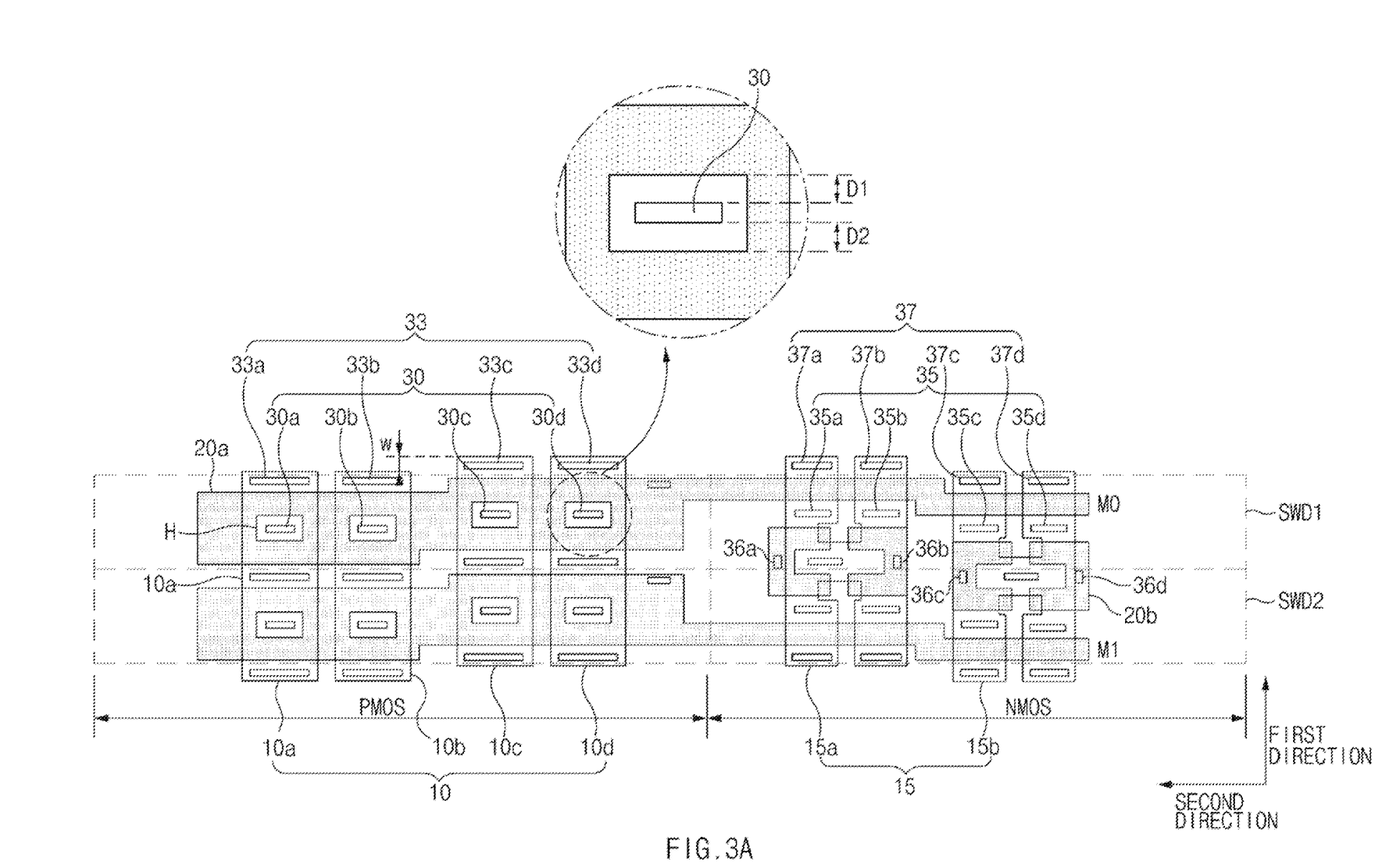
FIGS. 3A to 3C are layout diagrams illustrating a semiconductor memory device including a sub word line driver (SWD) according to an embodiment of the present disclosure.
Figure 3B:
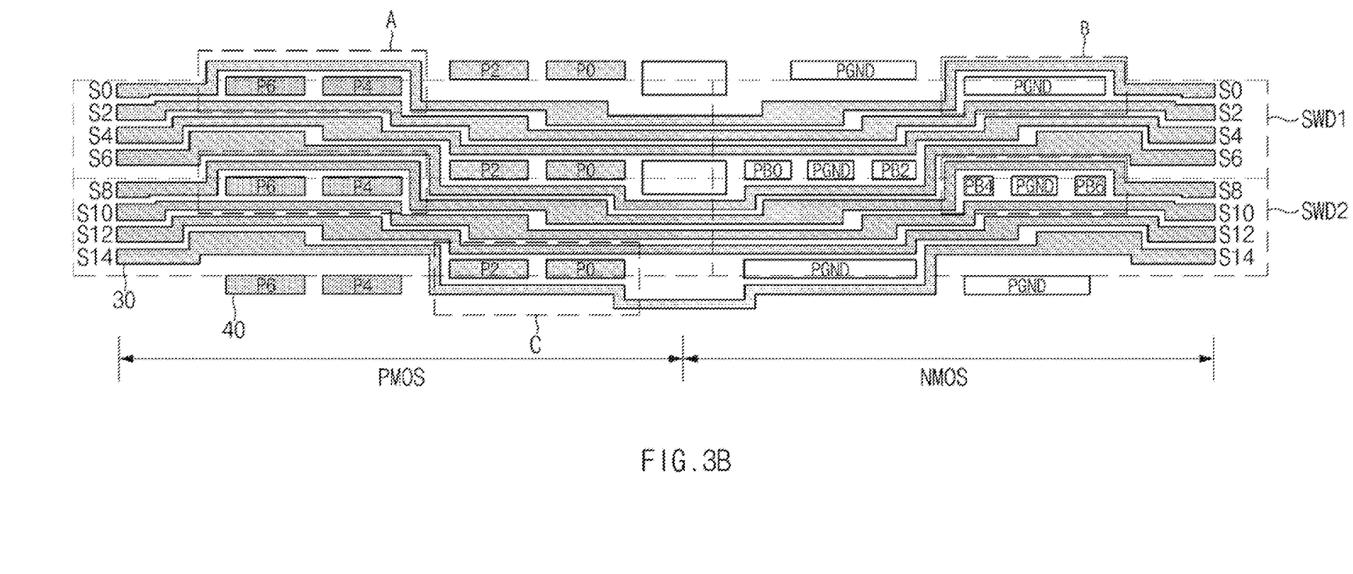
Figure 3C:
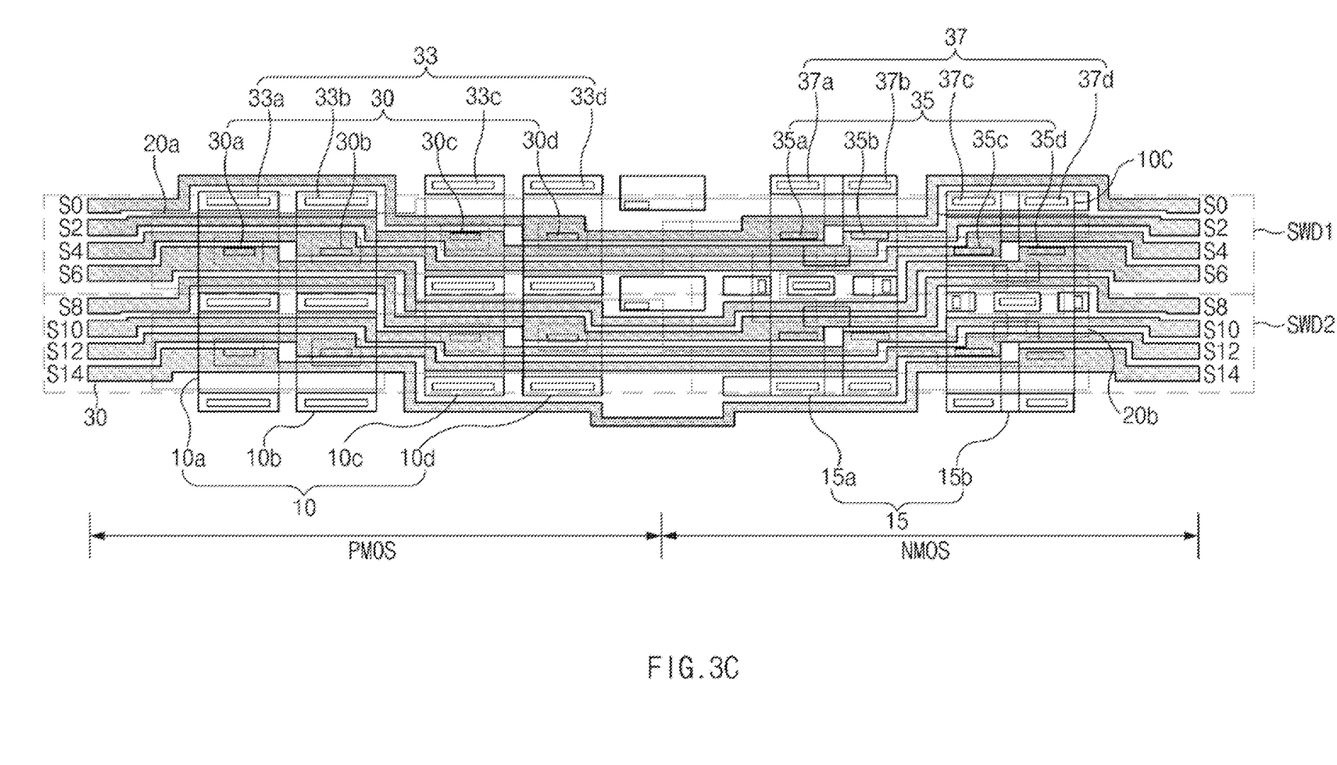

FIGS. 3A to 3C are layout diagrams illustrating a semiconductor memory device including a sub word line driver (SWD) according to an embodiment of the present disclosure.

Each of first and second SWDs shown in FIGS. 3A to 3C may include a PMOS transistor region and an NMOS transistor region.

The first and second SWDs shown in FIGS. 3A to 3C may correspond to the first SWDs (SWD(1) to SWD(4)) and the second SWDs (SWD(5) to SWD(8)) described with reference to FIG. 2, respectively.

The first SWD and the second SWD may be arranged in a manner such that the active region and the gate electrode are vertically symmetrical.

Referring to FIG. 3A, each SWD may include a device isolation region. Each SWD may be isolated by the device isolation region, and may include a plurality of active regions (10a, 10b, 10c, 10d, 15a, 15b) extended in a first direction.

The active regions (10, 15) may be repeatedly arranged in a second direction. A pair of active regions (10c, 10d) adjacent to the other pair of active regions (10a, 10b) in the second direction may be shifted by a predetermined distance W in the first direction.

A pair of active regions (15a, 15b) may be interconnected in the center part of the active regions (15) in the NMOS transistor region.

A plurality of gate electrodes (20a, 20b) extended in the second direction perpendicular to the active regions (10, 15) may be arranged.

Two gate electrodes (20a) may pass through the PMOS transistor region. In more detail, each of the two gate electrodes (20a) may pass through each of the first SWD and the second SWD. The gate electrode (20a) formed in the PMOS transistor region may include a plurality of rectangular holes H through which parts of the active region (10) are exposed.

In addition, four gate electrodes (20b) may pass through the NMOS transistor region. In more detail, each pair of four gate electrodes (20b) may pass through each of the first SWD and the second SWD. Each pair of four gate electrodes (20b) adjacent to each other in the second direction at a boundary surface between the first SWD and the second SWD may be connected to each other by sides thereof.

In this case, a critical dimension (CD) of the gate electrode (20a) arranged in the PMOS transistor region may be larger in size than the CD of the gate electrode (20b) arranged in the NMOS transistor region.

First metal contacts (30a, 30b, 30c, 30d) may be located over the active region (10) exposed by the holes H of the gate electrode (20a) of the PMOS transistor region, and second metal contacts (33a, 33b, 33c, 33d) may be located at both sides of the edge part and at the center part of the active region (10).

In addition, first metal contacts (35a, 35b, 35c, 35d) may be located over the active region (15) disposed between the gate electrodes (20b) of the NMOS transistor region, and second metal contacts (37a, 37b, 37c, 37d) may be located at both sides of the edge part and at the center part of the active region (15). Third metal contacts (36a, 36b) connected to the gate electrode (20b) formed in the center part of the active region (15) may be arranged.

In this case, the distances D1 and D2 between the first metal contacts (30, 35) and the gate electrodes (20a, 20b) may be uniform. Therefore, a minimum distance between the first metal contacts (30, 35) and the gate electrodes (20a, 20b) is extended such that a process margin of the metal signal lines to be formed in a subsequent process may be guaranteed. In addition, a bridge between the gate electrode and the metal contact may be prevented, and the CD of the gate electrode may be extended such that the extended CD may be beneficial to the gate patterning process.

The arrangement of the metal signal line and the metal pad will hereinafter be described with reference to FIG. 3B. For convenience, the elements described with reference to FIG. 3A will herein be omitted, and only the metal pads and the metal signal lines will be described.

First, metal pads (P0, P2, P4, P6) may be arranged in the PMOS transistor region of the SWD. In this case, each pair of the metal pads (P0, P2) and the metal pads (P4, P6) may be located in each row, and the pair of the metal pads (P4, P6) may be shifted from the neighboring pair of the metal pads (P0, P2) by a predetermined distance in the second direction. Each of the pairs of the metal pads (P0, P2, P4, P6) may be contained in neighboring SWD regions in the second direction. In more detail, the pair of the metal pads (P0, P2) may be disposed at the outermost region of a lower portion of the first SWD, and the other pair of the metal pads (P2, P4) may be disposed at the outermost region of an upper portion of the second SWD adjacent to the first SWD.

In addition, metal pads (PB0, PB2, PB4, PB6, PGND) may be arranged in the NMOS transistor region. Each pair of the metal pads (PB0, PB2) and the metal pads (PB4, PB6) may be located in each row, and the pair of the metal pads (PB0, PB2) may be shifted from the other pair of the metal pads (PB4, PB6) by a predetermined distance in the second direction.

Metal signal lines S0 to S14 may be formed in a line extended in the second direction. The metal signal lines (S0, S2, S4, S6, S8, S10, S12, S14) may be arranged in a first sub word line region and a second sub word line region. In more detail, the metal signal lines (S0, S2, S4, S6) may be sequentially arranged in the first sub word line region, and the metal signal lines (S8, S10, S12, S14) may be sequentially arranged in the second sub word line region in the same manner as in the first sub word line region.

The metal signal lines (S0, S8) of the PMOS transistor region may be bent upward along the metal pads (P4, P6) at a specific part 'A' adjacent to the metal pads (P4, P6).

The metal signal lines (S0, S8) of the NMOS transistor region may be bent upward along the metal pads (PB4, PB6, PGND) at a specific part 'B' adjacent to the metal pads (PB4, PB6, PGND).

In addition, the metal signal lines (S6, S14) of the PMOS transistor region may be bent downward along the metal pads (P0, P2) at a specific part 'C' adjacent to the metal pads (P0, P2).

Accordingly, the bent part of the metal signal lines (S0, S8, S6, S14) which are formed at the outermost regions of one of the first and second SWDs, may be arranged at the outermost regions of the other one of the first and second SWDs, which is adjacent to the one of the first and second SWDs. For example, the bent part of the metal signal lines (S0 and S8), which are formed at the outermost regions of the first SWD, may be arranged at the outermost regions of the second SWD, which is adjacent to the first SWD. For example, the bent part of the metal signal lines (S6, S14) which are formed at the outermost regions of the second SWD, may be arranged at the outermost regions of the first SWD, which is adjacent to the second SWD.

FIG. 3C is a layout diagram illustrating the active region (10), the gate (20), and the metal contacts (30, 33, 35, 37) of FIG. 3A and the metal pads (P0, P2, P4, P6, PB0, PB2, PB4, PB6, PGND) and the metal signal lines (S0 to S14) of FIG. 3B. The arrangement of the metal contacts (30, 33, 35, 37) and the metal pads (P0, P2, P4, and P6 and PB0, PB2, PB4, PB6, PGND), and the arrangement of the metal contacts (30, 33, 35, 37) and the metal signal line (S0 to S14) will hereinafter be described with reference to FIG. 3C.

The metal pads (P0, P2, P4, P6) of the PMOS transistor region may be coupled to the second metal contacts (33d, 33d, 33b, 33a) which are arranged at both sides and the center parts of the active regions (10d, 10c, 10b, and 10a).

The metal pads (PB0, PB2, PB4, PB6) of the NMOS transistor region may be coupled to the third metal contacts (36a, 36b, 36c, 36d) connected to the gate electrode (20b) formed at the center parts of the active regions (15a, 15b). The metal pad (PGND) of the NMOS transistor region may be coupled to the second metal contacts (37a, 37b, 37c, 37d) formed in both edge parts of the active regions (15a, 15b).

In addition, the metal signal lines (S0, S8) may be coupled to the first metal contact (30d) of the PMOS transistor region, and may be coupled to the first metal contact (35a) of the NMOS transistor region. The metal signal lines (S2, S10) may be coupled to the first metal contact (30c) of the PMOS transistor region, and may be coupled to the first metal contact (35b) of the NMOS transistor region.

The metal signal lines (S4, S12) may be coupled to the first metal contact (30b) of the PMOS transistor region, and may be coupled to the first metal contact (35c) of the NMOS transistor region. The metal signal lines (S6, S14) may be coupled to the first metal contact (30a) of the PMOS transistor region, and may be coupled to the first metal contact (35d) of the NMOS transistor region.

Referring back to FIG. 3A, the distances D1 and D2 between the first metal contacts (30, 35) and the gate electrodes (20a, 20b) may be uniform. Therefore, a minimum distance between the first metal contacts (30, 35) and the gate electrodes (20a, 20b) may be extended, such that a process margin between the metal signal lines can be guaranteed.

Figure 4:
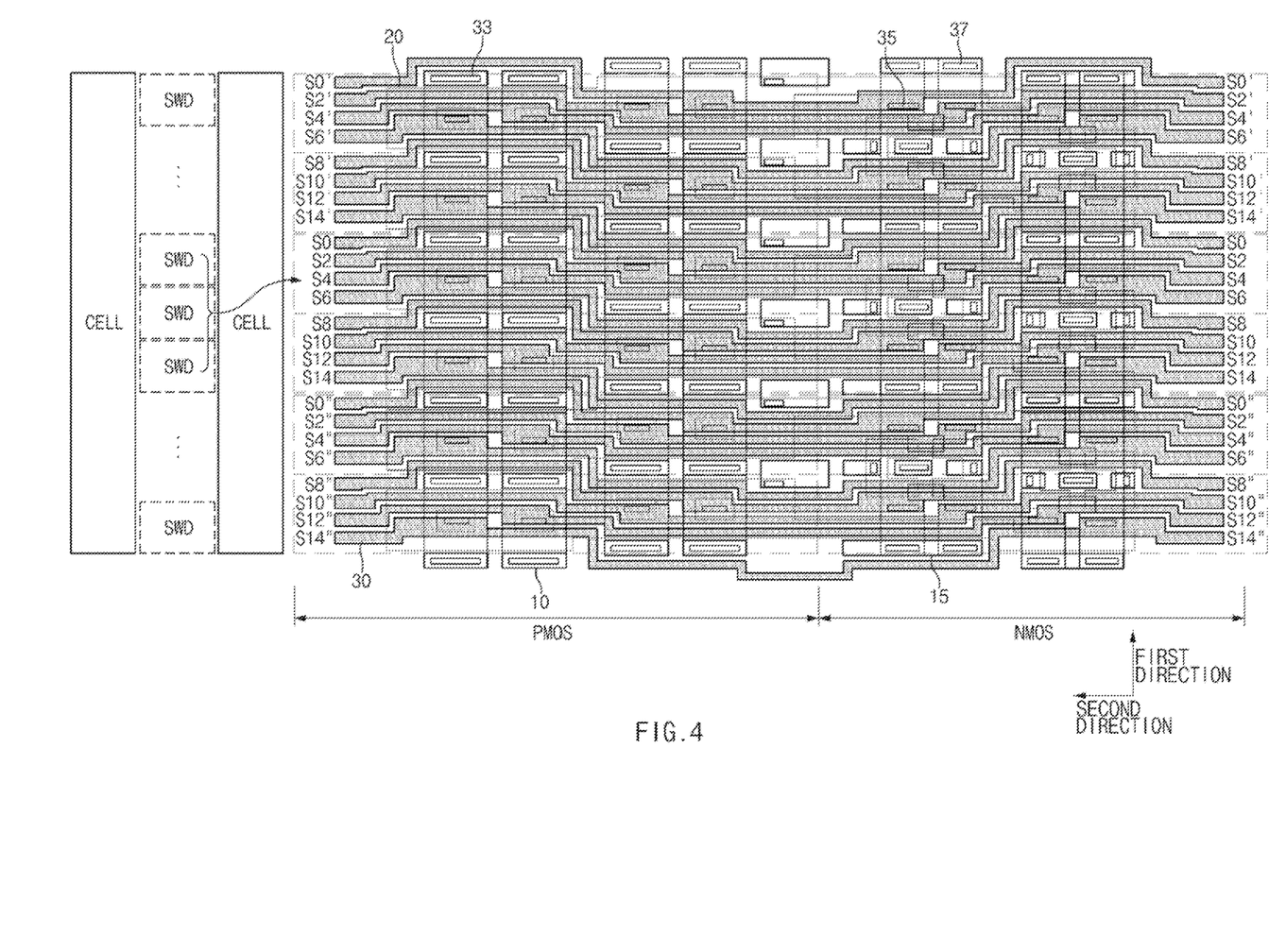
FIG. 4 is a layout diagram illustrating a semiconductor memory device including a sub word line driver (SWD) according to an embodiment of the present disclosure.

FIG. 4 is a layout diagram illustrating a semiconductor memory device including a sub word line driver (SWD) array according to an embodiment of the present disclosure.

Referring to FIG. 4, the sub word line driver (SWD) array may include a plurality of sub word line drivers (SWDs) repeatedly arranged between the cell regions, and may include the pitched layout structure in which a plurality of metal signal lines are regularly repeated.

For convenience, a (1×3) array, in which the sub word line driver (SWD) described with reference to FIG. 3C is extended and repeatedly arranged, will hereinafter be described. As can be seen from FIG. 3C, the sub word line driver (SWD) may include the PMOS transistor region and the NMOS transistor region, and may include the plurality of active regions (10, 15), the plurality of metal contacts (30, 33, 35, 37), the plurality of metal pads (P0, P2, P4, P6, PB0, PB2, PB4, PB6, PGND), and the plurality of metal signal lines (S0, S2, S4, S6, S8, S10, S12, S14).

The metal signal lines (S0 to S14) may be bent along the metal pads (P0, P2, P4, P6, PB0, PB2, PB4, PB6, PGND) at the specific part adjacent to the metal pads (P0, P2, P4, P6, PB0, PB2, PB4, PB6, PGND) such that the metal signal lines (S0 to S14) deviating from the outermost region of each of the SWDs may overlap with the neighboring SWDs.

The metal signal lines (S0, S14) arranged at the outermost region of each of the sub word line driver (SWD) may be bent upward or downward along the metal pads (P4, P6, PGND). Also, the sub word line drivers (SWDs) may be repeatedly arranged as shown in FIG. 4. Therefore, the metal signal line S0 arranged at the outermost region of an upper portion of each SWD may be arranged in an empty space formed by the bent metal signal line S14' in the neighboring SWD adjacent to the SWD of the metal line S0 in an upper direction. Therefore, when the SWDs are repeatedly arranged, the metal signal lines may be arranged across the neighboring SWDs, such that additional space is not required even though some parts of the metal signal lines are bent.

As described above, parts of the metal signal lines are bent with respect to the metal pads, such that the distances D1 and D2 between the gate and the metal contact of each SWD located in the pitched layout may be uniform. Therefore, the mismatch among the SWDs may be improved.

In addition, a minimum distance between the gate and the metal contact is extended so that a bridge between the gate and the metal contact is prevented. As a result, the critical dimension (CD) of the gate may be extended so that the gate patterning process margin may be guaranteed.

As is apparent from the above description, the embodiments of the present disclosure allow some metal signal lines of a sub wordline driver (SWD) to be bent on the basis of a metal pad, such that the embodiments can provide the following effects.

First, a uniform distance between a gate electrode and a metal contact of each sub word line driver (SWD) can be maintained, such that the mismatch between a plurality of sub word line drivers (SWDs) can be improved.

Second, a minimum distance between a gate electrode and a metal contact is increased, such that a process margin between the gate electrode and the metal contact is guaranteed, and the occurrence of a bridge between the gate electrode and the metal contact can be prevented. Further, a critical dimension (CD) of each gate electrode may be extended, such that gate patterning may be precisely performed.

Those skilled in the art will appreciate that embodiments of the present disclosure may be carried out in other ways than those set forth herein without departing from the scope and characteristics of these embodiments. The above embodiments are therefore to be construed in all aspects as illustrative and not restrictive.

The above embodiments of the present disclosure are illustrative and not limitative. Various alternatives and equivalents are possible. The invention is not limited by the type of deposition, etching polishing, and patterning steps described herein. Nor are embodiments limited to any specific type of semiconductor devices. For example, embodiments may be implemented in a dynamic random access memory (DRAM) device or non-volatile memory device. Other additions, subtractions, or modifications are obvious in view of the present disclosure and are intended to fall within the scope of the appended claims.

What is claimed is:

1. A sub word line driver of a semiconductor memory device comprising:
   a semiconductor substrate including a PMOS region and a NMOS region, wherein an active region is formed to extend in a first direction in the PMOS section;
   a first metal contact formed over an edge of the active region;
   a second metal contact formed over a middle of the active region;
   a gate electrode extended in a second direction perpendicular to the first direction, and formed to include a hole through which a part of the active region is exposed;
   a metal pad formed over the first metal contact and coupled to the first metal contact; and
   a metal signal line coupled to the second metal contact, extended in the second direction, and bent in the first direction at a specific part adjacent to the metal pad,
   wherein the second metal contact is formed over the exposed active region inside the hole of the gate electrode with a gap between the second metal contact and the Rate electrode,
   wherein the sub word line driver is repeatedly arranged in the first direction, and
   wherein the bent part of the metal signal line of the sub word line driver is arranged to overlap with a first adjacent sub word line driver, and the bent part of the metal signal line of a second adjacent sub word line driver is arranged to overlap with the sub word line driver such that an upper portion of the gap in the first direction has substantially a same size as a lower portion of the gap in the first direction.

2. The sub word line driver of claim 1, wherein the sub word line driver is arranged between a plurality of cell regions of the semiconductor memory device.

3. The sub word line driver of claim 1, further comprising a PMOS transistor region and a NMOS transistor region.

4. The sub word line driver of claim 3, wherein a critical dimension of the gate electrode arranged in the PMOS transistor region is larger in size than a critical dimension of the gate electrode arranged in the NMOS transistor region.

5. The sub word line driver of claim 1, wherein one or more of the metal signal lines arranged at an outermost part of an upper portion of the sub word line driver are bent along upper outer walls of the metal pads, and one or more of the metal signal lines arranged at an outermost part of an lower portion of the sub word line driver are bent along lower outer walls of the metal pads.

* * * * *